United States Patent [19]
Taya et al.

[11] Patent Number: 4,839,523
[45] Date of Patent: Jun. 13, 1989

[54] ION IMPLANTATION APPARATUS FOR SEMICONDUCTOR MANUFACTURE

[75] Inventors: Shunroku Taya, Mito; Katsunobu Abe; Atsushi Shibata, both of Katsuta, all of Japan

[73] Assignee: Hitachi, Ltd., Tokyo, Japan

[21] Appl. No.: 588,981

[22] Filed: Mar. 13, 1984

Related U.S. Application Data

[63] Continuation of Ser. No. 339,449, Dec. 31, 1981.

[30] Foreign Application Priority Data

May 2, 1980 [JP] Japan ................................ 55-57838
Apr. 27, 1981 [WO] PCT Int'l Appl. ... PCT/JP81/00099

[51] Int. Cl.$^4$ ............................................. H01J 37/317
[52] U.S. Cl. .................................... 250/492.2; 250/296
[58] Field of Search ............... 250/492.2, 492.21, 398, 250/283, 294, 296

[56] References Cited

U.S. PATENT DOCUMENTS 2,485,470 10/1949 Baker .................................. 250/283
3,194,961 7/1965 Ewald et al. ....................... 250/296
3,434,894 3/1969 Gale ................................... 250/492.2
3,569,757 3/1971 Brewer et al. ..................... 250/492.2

Primary Examiner—Bruce C. Anderson
Assistant Examiner—Jack I. Berman
Attorney, Agent, or Firm—Antonelli, Terry & Wands

[57] ABSTRACT

An ion implantation apparatus which is suited for manufacturing semiconductor devices and which is particularly suited for implanting double charged ions into the wafers 22. Ions of a predetermined mass only are selected by a mass-separating electromagnet 14 from an ion beam 12 that is emitted from an ion source 10, and are implanted into the wafer 22 via a slit 16. Between the slit 16 and the mass-separating electromagnet, there are provided field electrodes 24 having a direction of deflection which is the same as that of the mass-separating electromagnet 14 to separate ions having different energy levels, and deflection magnets 26 having a direction of deflection at right angles with the direction of deflection of the mass-separating electromagnet. The slit 16 is arranged so that undeflected neutral particles and low energy ions deflected by the field electrodes 24 will pass through the slit while high energy ions will be deflected the proper amount to pass through the slit. Correction means 32 can be located between the slit and the wafer to ensure that the beam passing through the slit strikes the wafer at the proper angle.

9 Claims, 1 Drawing Sheet

ION IMPLANTATION APPARATUS FOR SEMICONDUCTOR MANUFACTURE

This is a continuation of application Ser. No. 339,449, filed Dec. 31, 1981.

TECHNICAL FIELD

The present invention relates to an ion implantation apparatus employed in a process for manufacturing semiconductor devices.

BACKGROUND ART

An ion implantation apparatus is used for implanting boron ions, phosphorus ions or arsenic ions into wafers of silicon or the like, and usually has an ion source for generating an accelerated ion beam, an electromagnet for mass separation to separate and take out ion beams of particular masses only from the beam of ions, and a slit.

One known technique in this area is to use a rotatably and reciprocally movable disc which holds many wafers disposed in a path of the separated ion beam so that ions are implanted into many wafers at the same time (see U.S Pat. No. 3,778,626).

It has also been known to dispose deflection means between the electromagnet for mass separation and the slit in order to scan the ion beam in the lengthwise direction of the slit so that the ion beam is uniformly implanted onto the wafers (Japanese Patent Laid-Open Nos. 64373/76 and 49774/77).

Recently, it has been proposed to employ doubly charged ions $M^{++}$ so that the ions are implanted deeply into the wafers. When the doubly charged ions $M^{++}$ are implanted with the conventional ion implantation apparatus, however, the ions $M^+$ having a different energy level are also implanted into the wafers. That is, ions are not implanted into the wafers in a uniform depth. Moreover, impurities such as neutral particles $M^0$ may be mixed with the charged ions. In order to preclude this problem, it is necessary to install a large apparatus for deflecting and separating ions between the electromagnet for mass separation and the wafers, which, however, results in very bulky apparatus.

DISCLOSURE OF THE INVENTION

An object of the present invention is to provide an ion implantation apparatus which is capable of separating and removing ions having different energy levels without increasing the distance from means for mass separation to an ion implantation chamber in which the wafers are arrayed.

Another object of the present invention is to provide an ion implantation apparatus which is capable of separation and removing ions having different energy levels and neutral particles that are produced when the doubly charged ions are implanted.

A further object of the present invention is to provide an ion implantation apparatus which is capable of implanting desired ion beams containing no ions of different energy levels into the wafers always at a proper angle.

One of the features of the present invention is to place a first deflection means having the same direction of deflection as that of the mass-separation means between the mass-separation means and the slit, so that ions having different energy levels are dispersed, and so that ions having a particular energy level only are permitted to pass through the slit to be implanted into the wafers in the ion implantation chamber. The first deflection means works to separate and remove ions having different energy levels that are likely to be produced when doubly charged ions having a particularly high energy level are implanted. Therefore, ions can be implanted into the wafers in a uniform depth. Further, because the first deflection means is disposed before the slit, ions at a distance of the width of the slit would be sufficient. Accordingly, the distance between the mass-separation means and the ion implementing chamber can be shortened. Moreover, since the distance of dispersion is little, small change develops in the incident angle of implanting ions into the wafers.

Another feature of the present invention is to place a second deflection means between the first deflection means and the slit. The second deflection means has a direction of deflection perpendicular to that of means for mass separation. The second deflection means works to deflect the ion beam so that the ion beams are separated from neutral particles that are generated when the doubly charged ions are implanted and that pass straight through the magnet field and further works to scan ion beams and to direct the ion beams onto a plurality of rotary discs. Further, since the second deflection means is disposed before the slit, a long distance from the second deflection means to the wafers can be maintained. Therefore, the required intensity of deflection can be reduced and the angle of deflection can be reduced, too.

A further feature of the present invention is to dispose a third deflection means on the outlet side of the slit having an opposite direction of deflection to that of the first deflection means. The third deflection means works to correct the change in the deflection angle of ion beam and to always maintain a proper incident angle of ions

THE BEST MODE EMBODIMENTS OF THE INVENTION

Figure 1:
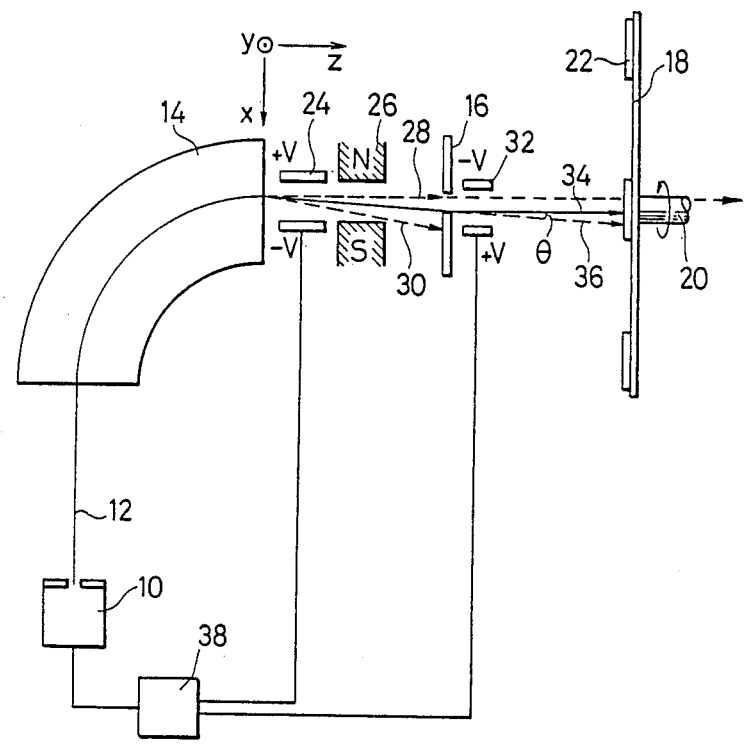
FIG. 1 is a plan view of an ion implantation apparatus according to an embodiment of the present invention.

Ions ionized and accelerated in an ion source 10 are introduced in the form of an ion beam 12 into an electromagnet 14 for mass separation. Field electrodes 24 which serve as a first deflection means are provided in the vicinity of outlet of the electromagnet 14 for mass separation. Deflection magnets 26 which serve as a second deflection means are provided behind the field electrodes 24. A slit 16 for separation is disposed behind the deflection magnets. An ion beam 34 which passed between the slit passes through field electrodes 32 that serve as a third deflection means, and the ions are implanted onto a rotary disc 18 which rotates with a rotary shaft 20 as a center and which holds a number of wafers 22. The ion source 10 and field electrodes 24, 32 are controlled by an acceleration power supply 38.

The field electrodes 24 are installed in the vicinity of outlet of the electromagnet 14 for mass separation. If the direction of deflection by the mass-separating electromagnet is denoted by x in FIG. 1, the deflecting direction by the field electrodes 24 is set to the same direction as the direction x. Here, let it be assumed that the doubly charged ions having high energy levels are implanted. Among the ions emitted from the ion source, ions $M_2^+$ having an energy level eV may be separated as $M_2^+ \rightarrow M^+ + M^0$ by impinging upon the residual gas molecules in the tube before they enter into the magnetic field. If the thus formed ions $M^+$ having the energy level $\frac{1}{2}$eV are mixed with the doubly charged ions $M^{++}$, the wafers are implanted with ions in nonuniform depth, since the doubly charged ions $M^{++}$ have energy four times as great as that of the ions $M^+$. Namely, the ions pass through the mass-separating electromagnet 14 according to a relation, $$B_O \cdot r_O = K\sqrt{MV/e} \qquad (1)$$

where $B_O$ denotes a magnetic flux density of the mass-separating electromagnet, $r_O$ denotes a radius of gyration of ions in the magnetic field, M denotes a mass number of an ion, V denotes an acceleration voltage, e denotes an electric charge of an ion, and K denotes a proportional constant.

Here, it is assumed that the magnetic flux density in the magnetic field is constant, and ions which turn at a particular radius of gyration $r_O$ only are allowed to pass. If the two ions have an equal mass number M, if an equal acceleration voltage v is applied if the two ions have an equal electric charge e, and if the radius of gyration $r_O$ of ions becomes equal under the condition of the same magnetic flux density $B_O$, then it is not possible to separate the two ions in the mass separator. If the doubly charged ion $M^{++}$ is compared with the ion $M^+$, the doubly charged ion has a mass number M, an acceleration voltage V and an electric charge 2e. Therefore, the equation (1) can be written as follows:

$$B_O \cdot r_O = K\sqrt{MV/2e}$$

On the other hand, the ion $M^+$ has a mass number M, an acceleration voltage V/2 and an electric charge e. Therefore, $$B_O \cdot r_O = K\sqrt{MV//2e}$$

which is the same as above. Consequently, the ion $M^+$ is not separated from the doubly charged ion $M^{++}$. The doubly charged ion has an energy E which is given by, $$E = 2eV$$

whereas, with regard to the ion $M^+$, the ion $M_2^+$ which had an energy eV has been separated into $M^+$ and $M^0$, then, the energy E' of $M^+$ is given by, $$E' = \tfrac{1}{2}eV$$

which is one-fourth as great as that of the doubly charged ion. Accordingly, the doubly charged ions $M^{++}$ are implanted deeply into the wafers, but the separated ions $M^+$ having small energy level are not deeply implanted into the wafers. In other words, the ion distribution in the wafer becomes nonuniform in the direction of depth.

The field electrodes 24 work to deflect ion beam 30 having undesired energy level and a desired ion beam 36 in the direction x, so that the desired ion beam 36 only is allowed to pass through the slit 16. Also, electrodes 34 begin a separation of neutral particles $M^0$ from the ion beams 30 and 36, as shown in FIG. 1.

The neutral particles $M^0$ 28 produced by the separation of $M_2^+$ are further separated after passing straight through the magnetic field established by the deflection magnets 26 as shown in FIG. 1. The deflection by the magnets 26 is in the direction y which is perpendicular to the deflection direction x by the mass-separating electromagnet 14. Therefore, if the length of the slit 16 is sufficiently extended in the direction y, the deflected ion beams pass through the slit 16 and toward the target wafer irrespective of the angle of deflection by the deflection operation. Thus, the removal of neutral particles and the implanting of particular ions only are attained since the undeflected neutral particles will not receive the necessary combined deflection of the electrodes 24 and magnets 26 to be directed toward the target wafer.

The slit 16 has been installed at such a position as is suited for ordinary ion implanting where it is not required to separate ions depending upon the energy levels (provided the wafer would be located to be struck by the undeflected beam passing through the slit). When the electric field is applied, a different trajectory is established compared with when the electric field is not applied. In order for the ion beam of a suitable energy level deflected through the electric field to pass through the slit 16, therefore, it is necessary to finely adjust the mass-separating electromagnet 14 thereby to change the trajectory. Thus the ion beam 36 which has passed through the slit 16 is deflected by an angle $\theta$ as shown in FIG. 1. This angle $\theta$ makes a difference from the ordinary incident angle of ion implantation, and may become a cause of decreased implanting precision or channeling effect. To correct the angle $\theta$, therefore, an electric field is established by the electrodes 32 that serve as the third deflection means, in order to deflect the beam in the direct on opposite to the deflecting direction by the electrodes 24, as represented by an ion beam 34.

Figure 2:
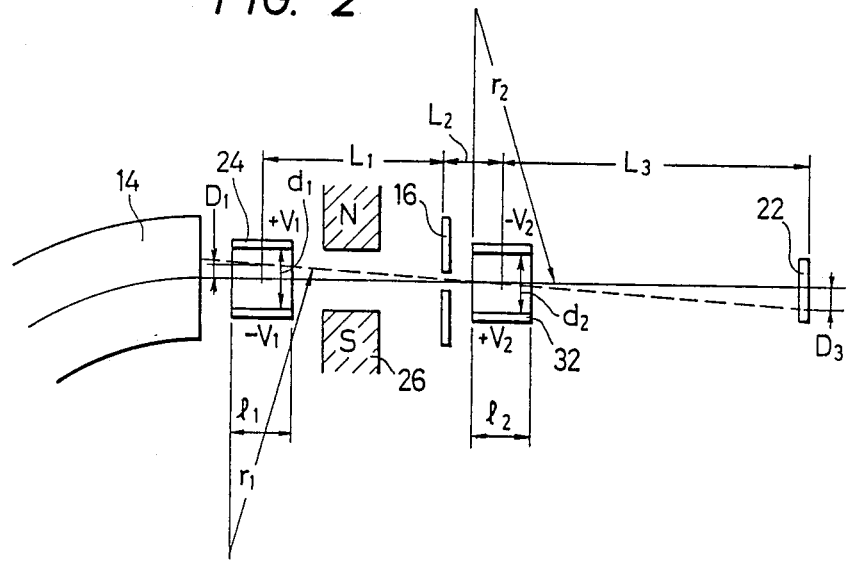
FIG. 2 is a plan view showing, in an enlarged scale, an energy filter portion of the ion implantation apparatus of FIG. 1.

The principle is now explained by which ions having different energy levels are separated, in conjunction with FIG. 2.

In FIG. 2, the following relations are established $$\text{Kinetic energy: } eU = \tfrac{1}{2}Mv^2 \qquad (2)$$

$$\text{Centrifugal force: } \frac{Mv^2}{r_1} = e\frac{2V_1}{d_1} \qquad (3)$$

where $r_1$ denotes a radius of trajectory in the electric field established by the electrodes 24, $d_1$ denotes a gap between the electrodes, $\pm V_1$ denotes a voltage which is applied, U denotes a voltage for accelerating the ions, M denotes mass of an ion, v denotes velocity, and e denotes an electric charge.

From the equations (2) and (3), the radius $r_1$ of trajectory is given by, $$r_1 = \frac{U}{V_1} d_1 \qquad (4)$$

and there is no dispersion in the electric field by the charge of ions. However, since the ion $M^+$ produced by the separation has a kinetic energy $\tfrac{1}{2}eU$, the radius of trajectory is given by, $$r_1' = \frac{\frac{1}{2}U}{V_1} \cdot d_1 = \frac{1}{2}r_1 \quad (5)$$

which is one-half as large as that of the doubly charged ion. If the effective length of the electrodes 24 is denoted by $l_1$, and the distance up to the slit 16 by $L_1$, the dispersion distance $D_1$, which is defined as a distance, on the slit, of the deflection of a particular beam from the non-deflected beam, of doubly charged ions on the slit 16 is given by, $$D_1 = \frac{l_1 \cdot L_1}{r_1} \quad (6)$$

With regard to the ion $M^+$, the radius of trajectory is $r_1' = \frac{1}{2}r_1$. Therefore, the dispersion distance is given by $2D_1$.

For example, when the acceleration voltage is $U=80$ kV, the gap across the electrodes is $d_1=4$ cm, the effective length of the field electrodes 24 is $l_1=14$ cm, the distance from the center of the field electrodes 24 to the slit 16 is $L_1=38$ cm, and the separated distance between the doubly charged ions and the separated ions is 6 mm, the radius of trajectory $r_1$ in the field established by electrodes 24 is given as follows in view of the equation (6), $$r_1 = 887 \text{ cm}$$

From the equation (4), the voltage that is to be applied in this case is required as, $$V_1 = \pm 361 \text{ volts}$$

Explanation will now be made with respect to the field electrodes 32. The ion beam is deflected by an angle $\theta$ defined in the following equation (7) when $\theta$ is considerably small, as it passes through the electrodes 24.

$$\theta = D_1/L_1 \text{ radian} \quad (7)$$

and then passes through the slit 16. Therefore, unless a voltage is applied to the field electrodes 32, the ion beam is deviated from the central axis by a distance, $$D_3 = \theta(L_2 + L_3) = \frac{D_1(L_2 + L_3)}{L_1} \quad (8)$$

as it travels over a distance of $L_2+L_3$ from the slit 16 to the wafer 22, when $\theta$ is considerably small. To correct the above deviation, the following voltage will have to be applied to the field electrodes 32. That is, if the voltage applied to the field electrodes 32 is denoted by $\pm V_2$, the gap across the electrodes by $d_2$, the effective length thereof by $l_2$, and the radius of trajectory by $r_2$, the following relations hold true in view of the above-mentioned equations (4) and (6), $$\text{Radius of trajectory: } r_2 = \frac{U}{V_2} d_2 \quad (9)$$

$$\text{Dispersing distance: } D_2 = \frac{l_2 L_3}{r_2} = \frac{l_2 L_3 V_2}{U d_2} \quad (10)$$

Therefore, in order for the dispersing distance $D_2$ caused by the field electrodes 32 to become in accordance with the deflection $D_3$ at the position of wafer that is caused by the field electrodes 24, the following relation should hold true.

$$\frac{l_2 L_3 V_2}{d_2} = \frac{l_1(L_2 + L_3)V_1}{d_1} \quad (11)$$

However, the direction of the electric field $\pm V_2$ is opposite to that of the electric field $\pm V_1$.

When the electrodes 24 and 32 have the same shapes ($l_2=l_1$, $d_2=d_1$), there holds the following relation.

$$V_2 = \frac{L_2 + L_3}{L_3} V_1 \quad (12)$$

For example, when $L_2=6$ cm and $L_3=67$ cm, the voltage $V_2$ is given as follows:

$$V_2 = 1.09 \, V_1 = \pm 393 \text{ volts} \quad (13)$$

As will be understood from the equation (4), if a ratio of the voltage applied to establish the electric field to the voltage applied to the ions is maintained constant, no change develops in the radius r of trajectory in the electric field. Therefore, the deflected trajectory of ions is not deviated even when the acceleration voltage is changed.

Further, if the voltages applied to the field electrodes 24, 32 are obtained from the acceleration voltage through resistors, no additional power supply is required. Moreover, the implanting precision can be increased. In this case, one of the electrodes should be grounded, and a positive potential 2 V should be applied to the other of the electrodes.

According to the embodiment of the present invention, therefore, means for separating ions having different energy levels is installed in front of the slit 16 so that the beams need be dispersed by a distance of as small as about the width of the slit 16. Consequently, a small voltage can be applied to establish the electric field, and the trajectory is deflected by a small angle.

According to the embodiment of the present invention, furthermore, the deflection magnets 26 which work to further separate neutral particles from the ions are installed between the mass-separating electromagnet 14 and the slit 16, and the direction of deflection is perpendicular to the mass-separating electromagnet 14. Consequently, the highly charged ions $M^{++}$ reach the wafer while the neutral particles do not if the length of the slit 16 is simply extended without the need of changing the position of the slit in the direction x. Moreover, the distance from the deflection magnets to the wafer is sufficiently longer than when the mass-separating means is installed at the back of the slit 16, and the intensity of the magnetic field can be small and the angle of deflection is small, too.

According to the present invention as mentioned above, the distance from the mass-separating means to the wafer can be reduced to a striking degree.

We claim:
1. An ion implantation apparatus for the manufacture of semiconductor devices comprising:
   an ion source for emitting an accelerated ion beam including ions having a first energy level, ions having a second energy level, said second energy level being greater than said first energy level, and neutral particles;

a mass-separating means for deflecting the ion beam depending upon the mass;

a slit for selectively permitting the passage of the deflected ion beam, so that said ions of said second energy level are passed through said slit, and ions of said first energy level are intersected with said slit;

a first deflection means installed between said mass-separating means and said slit to deflect both ions of said first energy level and said second energy level in the same direction as the deflection direction of said mass-separating means so that said ions of said first energy level are deflected by a different distance in said direction than said ions of said second energy level to separate said ions of said first energy level from ions of said second energy level;

a second deflection means provided between said first deflection means and said slit to deflect the ion beam in the direction perpendicular to that of said mass-separating means wherein said ions of said second energy level are deflected by said first and second deflection means to be directed through said slit toward a predetemined point, said ions of said first energy level are deflected such that they do not pass through said slit and are not directed toward said predetermined point, and said neutral particles remain undeflected by either of said first or second deflection means so that said neutral particles are separated from ions of said first energy level and said second energy level and are not directed toward said predetermined point.

2. An ion implantation apparatus for the manufacture of semiconductor devices according to claim 1, wherein a third deflection means is installed on the outlet side of said slit to deflect the ion beam passing through said slit in the direction opposite to that of said first deflection means.

3. An ion implantation apparatus for the manufacture of semiconductor devices according to claim 1, wherein said first deflection means comprises field electrodes.

4. An ion implantation apparatus for the manufacture of semiconductor devices according to claim 2, wherein said first deflection means comprises field electrodes.

5. An ion implantation apparatus for the manufacture of semiconductor devices according to claim 1, wherein said deflection means comprises a deflection magnet.

6. An ion implantation apparatus for the manufacture of semiconductor devices according to claim 2, wherein said second deflection means comprises a deflection magnet.

7. An ion implantation apparatus for the manufacture of semiconductor devices according to claim 2, wherein said third deflection means comprises field electrodes.

8. An ion implantation apparatus for the manufacture of semiconductor devices according to claim 4, wherein said third deflection means comprises field electrodes.

9. An ion implantation apparatus for the manufacture of semiconductor devices according to claim 6, wherein said third deflection means comprises field electrodes.

* * * * *